United States Patent
Farnworth et al.

(10) Patent No.: US 6,451,624 B1
(45) Date of Patent: Sep. 17, 2002

(54) STACKABLE SEMICONDUCTOR PACKAGE HAVING CONDUCTIVE LAYER AND INSULATING LAYERS AND METHOD OF FABRICATION

(75) Inventors: Warren M. Farnworth, Nampa, ID (US); Alan G. Wood, Boise, ID (US); Mike Brooks, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/923,144

(22) Filed: Aug. 7, 2001

Related U.S. Application Data

(60) Continuation-in-part of application No. 09/259,861, filed on Mar. 1, 1999, now Pat. No. 6,271,056, which is a division of application No. 09/092,779, filed on Jun. 5, 1998, now Pat. No. 6,020,629.

(51) Int. Cl.[7] ............................................. H01L 21/44
(52) U.S. Cl. ..................... 438/106; 438/118; 438/685; 438/686
(58) Field of Search ................................ 438/106, 118, 438/685, 686; 257/685, 686, 680

(56) References Cited

U.S. PATENT DOCUMENTS

| | | | |
|---|---|---|---|
| 4,505,799 A | | 3/1985 | Baxter |
| 4,996,587 A | | 2/1991 | Hinrichsmeyer et al. |
| 5,063,177 A | | 11/1991 | Geller et al. |
| 5,107,328 A | | 4/1992 | Kinsman |
| 5,123,850 A | * | 6/1992 | Elder et al. ................ 439/67 |
| 5,138,434 A | | 8/1992 | Wood et al. |
| 5,155,067 A | | 10/1992 | Wood et al. |
| 5,229,647 A | | 7/1993 | Gnadinger |
| 5,266,912 A | | 11/1993 | Kledzik |
| 5,334,857 A | | 8/1994 | Meanitt et al. |
| 5,384,689 A | | 1/1995 | Shen |
| 5,444,296 A | | 8/1995 | Kaul et al. |
| 5,468,999 A | | 11/1995 | Lin et al. |
| 5,474,957 A | | 12/1995 | Urushima |
| 5,517,125 A | * | 5/1996 | Posedel et al. ............. 324/755 |
| 5,562,971 A | | 10/1996 | Tsuru et al. |
| 5,633,530 A | | 5/1997 | Hsu |
| 5,646,828 A | | 7/1997 | Degani et al. |
| 5,674,785 A | | 10/1997 | Akram et al. |
| 5,677,566 A | | 10/1997 | King et al. |
| 5,689,091 A | | 11/1997 | Hamzehdoost et al. |
| 5,696,033 A | | 12/1997 | Kinsman |
| 5,723,900 A | | 3/1998 | Kojima et al. |
| 5,739,585 A | | 4/1998 | Akram et al. |
| 5,753,857 A | | 5/1998 | Choi |

(List continued on next page.)

Primary Examiner—John F. Niebling
Assistant Examiner—Olivia T Luk
(74) Attorney, Agent, or Firm—Stephen A. Gratton

(57) ABSTRACT

A semiconductor package includes a substrate and a semiconductor die wire bonded, or alternately flip chip bonded, to the substrate. The substrate includes three separate layers including a conductive layer having a pattern of conductive traces, a first insulating layer covering the conductive traces, and a second insulating layer covering the die. The insulating layers also include planar surfaces having external contacts, and conductive vias in electrical communication with the external contacts and with the conductive traces. The external contacts have matching patterns, such that the package can be stacked on a substantially identical package to form a stacked electronic assembly. In addition, the packages in the stacked assembly can have different circuit configurations, and can perform different functions in the assembly. A method for fabricating the package includes the steps of providing the conductive layer having the conductive traces, attaching the die to the conductive traces, forming the first insulating layer on the conductive layer, forming the second insulating layer on the die, forming the conductive vias through the insulating layers, and then forming the external contacts on the planar surfaces of the insulating layers.

18 Claims, 7 Drawing Sheets

U.S. PATENT DOCUMENTS

| | | |
|---|---|---|
| 5,763,939 A | 6/1998 | Yamashita |
| 5,789,803 A | 8/1998 | Kinsman |
| 5,796,038 A | 8/1998 | Manteghi |
| 5,811,579 A | 9/1998 | Akram |
| 6,013,948 A | 1/2000 | Akram et al. |
| 6,020,629 A | 2/2000 | Farnworth et al. |
| 6,072,323 A | 6/2000 | Hembree et al. |
| 6,094,058 A | 7/2000 | Hembree et al. |
| 6,097,087 A | 8/2000 | Farnworth et al. |
| 6,107,109 A | 8/2000 | Akram et al. |
| 6,235,554 B1 | 5/2001 | Akram et al. |
| 6,271,056 B1 | 8/2001 | Farnworth et al. |
| 6,294,837 B1 | 9/2001 | Akram et al. |
| 6,303,981 B1 | 10/2001 | Moden |

* cited by examiner

STACKABLE SEMICONDUCTOR PACKAGE HAVING CONDUCTIVE LAYER AND INSULATING LAYERS AND METHOD OF FABRICATION

CROSS REFERENCE TO RELATED APPLICATIONS

This application is a continuation-in-part of application Ser. No. 09/259,861, filed Mar. 1, 1999, U.S. Pat. No. 6,271,056, which is a division of application Ser. No. 09/092,779, filed Jun. 5, 1998, U.S. Pat. No. 6,020,629.

FIELD OF THE INVENTION

This invention relates generally to semiconductor packaging. More particularly, this invention relates to a stackable semiconductor package having an internal conductive layer, to a method for fabricating the package and to an electronic assembly incorporating the package.

BACKGROUND OF THE INVENTION

Semiconductor dice or chips are typically contained in semiconductor packages. This is sometimes referred to as the first level of packaging. A package is required to support, protect, and dissipate heat from a die, and to provide a lead system for power and signal distribution to the die. Typically, the package includes a substrate for supporting the die, an encapsulant for protecting the die and external contacts that provide the lead system to the die.

For example, the substrate can comprise a lead frame for plastic packages, or a circuit board material for BGA packages. The encapsulant can comprise a plastic body which completely encloses the die and the substrate, or simply a glob top which encapsulates only the die. Depending on the type of package, the external contacts can comprise leads, solder balls, pads or pins.

Semiconductor packages can also be constructed such that several packages can be stacked with their external contacts electrically interconnected. The present invention is directed to a semiconductor package that is designed for stacking with similar packages for constructing an electronic assembly. The package includes an internal conductive layer that simplifies the fabrication process, and allows different packages of the assembly to have different circuit configurations.

SUMMARY OF THE INVENTION

In accordance with the present invention, a stackable semiconductor package, a method for fabricating the package, and an electronic assembly constructed using multiple packages are provided.

The package includes a substrate, and a semiconductor die attached to the substrate. The substrate comprises three separate layers including a conductive layer having conductive traces in a desired configuration, and first and second insulating layers on opposing sides of the conductive layer. One of the insulating layers covers the die, and one of the insulating layers covers the conductive traces. The package also includes electrically conductive vias through the insulating layers in electrical communication with the conductive traces. In addition, the package includes arrays of external contacts, such as pads or balls, arranged in matching patterns on each insulating layer in electrical communication with the conductive vias and the conductive traces.

In a first embodiment of the package, the conductive layer comprises a segment of a lead frame having lead fingers which form the conductive traces. In addition, the die is attached and wire bonded to the lead fingers, and the insulating layers are applied to the opposing sides of the lead fingers. Further, the insulating layers comprise a polymer, such as a photoimageable resist, a cured layer, or a tape material, that is etched, developed or machined with openings for the conductive vias.

In a second embodiment of the package, the conductive layer comprises a metal layer, such as copper, patterned with the conductive traces. In this embodiment, the metal layer can be deposited on, or laminated to one of the insulating layers, and then etched to form the conductive traces. In addition, the die is flip chip mounted to the conductive traces, and covered by the other insulating layer.

A method for fabricating the first embodiment package includes the steps of providing the lead frame, and then attaching and wire bonding a plurality of dice to the lead fingers. The method also includes the steps of forming the insulating layers on the lead fingers and the die, forming the openings in the insulating layers, and then depositing a conductive material into the openings to form the conductive vias. In addition, the method includes the steps of forming matching patterns of external contacts on the insulating layers in electrical communication with the conductive vias, and then singulating the lead frame into separate packages.

A method for fabricating the second embodiment package includes the steps of providing the conductive layer on the first insulating layer, and etching the conductive layer to form the conductive traces. In this embodiment the conductive layer and the first insulating layer can be provided as a bi-material panel, such as a glass resin/copper laminate. The method also includes the step of flip chip bonding a plurality of dice to the conductive traces, and then covering the dice with the second insulating layer. In addition, the method includes the steps of forming matching patterns of external contacts on the insulating layers in electrical communication with the conductive vias, and then singulating the panel into separate packages.

In either embodiment, the package is configured for stacking to substantially similar packages to form the electronic assembly. In addition, different packages of the assembly can have different configurations of conductive traces or wire bonds, that provide customized circuit configurations for the different layers of the assembly. This allows selected packages of the assembly to perform a required electronic function, such as address, while the remaining package perform other electronic functions. Rather than providing different circuit configurations in the conductive traces, different wire bonding configurations for the conductive traces can be used.

DETAILED DESCRIPTION OF THE PREFERRED EMBODIMENTS

Figure 1A:
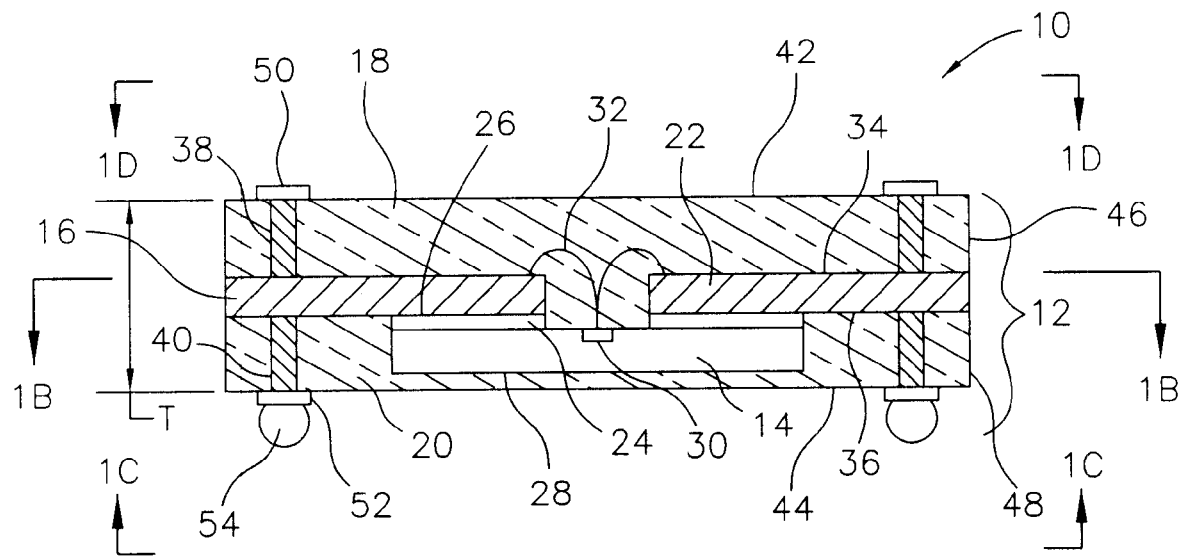
FIG. 1A is an enlarged cross sectional view of a first embodiment semiconductor package constructed in accordance with the invention.

Referring to FIGS. 1A–1D, a first embodiment semiconductor package 10 constructed in accordance with the invention is illustrated. The package 10 includes a substrate 12, and a semiconductor die 14 attached and wire bonded to the substrate 12. The substrate 12 comprises three separate layers including a conductive layer 16, a first insulating layer 18, and a second insulating layer 20.

The die 14 includes a semiconductor substrate, such as silicon or gallium arsenide, containing integrated circuits fabricated using well known processes. The die 14 can be a conventional semiconductor component such as a dynamic random access memory (DRAM), a synchronous DRAM (SDRAM), a static random-access memory (SRAM), an erasable programmable read-only memory (EPROM), a logic circuit (LOGIC), or any other semiconductor device that requires packaging.

The die 14 includes a circuit side 26 (face) and a back side 28. In addition, the die 14 includes a pattern of die contacts 30 on the circuit side 26 in electrical communication with the integrated circuits contained on the die 14. In the illustrative embodiment, the die contacts 30 comprise planar bond pads formed of a wire bondable material (e.g., aluminum). In addition, the die contacts 30 are arranged in a single row along a center line of the circuit side 26 (e.g., center connect). However, the die contacts 30 can comprise any type of die contact including bumped contacts arranged in any suitable pattern (e.g., edge connect, end connect). Also for illustrative purposes, the die contacts 30 are shown as being recessed below a passivation layer on the circuit side 26 of the die 14 as is conventional.

In the illustrative embodiment the die 14 has a generally rectangular peripheral outline, and the package 10 also has a generally rectangular peripheral outline. However, the die 14 and the package 10 can alternately have any peripheral outline such as square, circular or oval. Also, a thickness of the die 14 can be conventional with a thickness of between about 0.2 mm and 0.5 mm being representative.

Figure 1B:
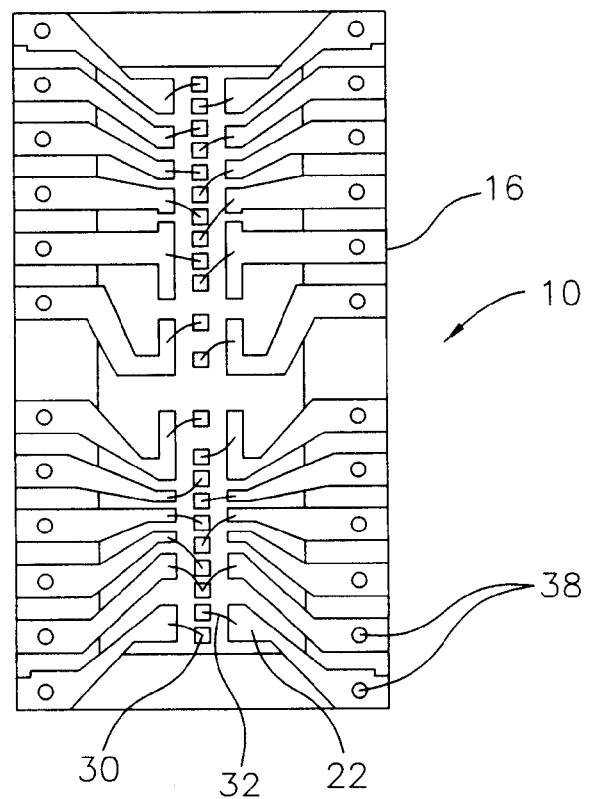
FIG. 1B is cross sectional view of the package taken along line 1B—1B of FIG. 1A illustrating a conductive layer of the package.

As shown in FIG. 1B, the conductive layer 16 includes a pattern of conductive traces 22 configured for attachment to the circuit side 26 of the die 14. The conductive traces 22 are also configured for wire bonding to the die contacts 30 on the die 14, and can include plated metal layers, such as silver or gold, to facilitate wire bonding. The conductive layer 16 can comprise a highly conductive metal such as an alloy of nickel or copper selectively plated with silver. In the illustrative embodiment the conductive layer 16 comprises a segment of a lead frame similar to a lead-on-chip lead frame. As such, the conductive traces 22 are formed by the lead fingers of the lead frame.

As also shown in FIG. 1B, wires 32 are bonded to the tip portions of the conductive traces 22, and to the die contacts 30 on the die 14. In addition, an adhesive layer 24 (FIG. 1A) attaches the face side 26 of the die 14 to the conductive traces 22. The adhesive layer 24 can comprise a curable polymer, such as an epoxy, or an adhesive tape suitable for die attach.

As shown in FIG. 1A, the first insulating layer 18 is formed on a first side 34 of the conductive layer 16, and the second insulating layer 20 is formed on an opposing second side 36 of the conductive layer 16. The first insulating layer 18 covers and electrically insulates the wires 32, and the second insulating layer 20 covers and protects the die 14. The thicknesses of the insulating layers 18, 20 can be selected to just cover the wires 32 and the die 14, such that a thickness T of the package 10 can be as small as possible In addition, the exposed major surfaces 42, 44 of the insulating layers 18, 20 can be generally planar as shown, and the edges 46, 48 of the insulating layers 18, 20 generally perpendicular to the major surfaces 42, 44.

The insulating layers 18, 20 can be formed of a same material, or can be different materials. For example, the insulating layers 18, 20 can comprise a curable polymer, such as a photoimageable resist, polyimide, BCB (benzocyclobutene) or a thermal set epoxy, formed using a suitable process such as molding, or dispensing through a nozzle. Alternately, the insulating layers 18, 20 can comprise a tape material such as polyimide tape, or "KAPTON TAPE" having an adhesive surface which adheres to the conductive layer 16.

As also shown in FIG. 1A, the package 10 includes conductive vias 38 in the first insulating layer 18, and conductive vias 40 in the second insulating layer 20. The conductive vias 38, 40 comprise openings in the insulating layers 18, 20 at least partially filled with a conductive material, such as a metal or a conductive polymer. The openings for the conductive vias 38, 40 can be formed using a suitable process such as developing, etching or laser machining the insulating layers 18, 20.

Figure 1C:
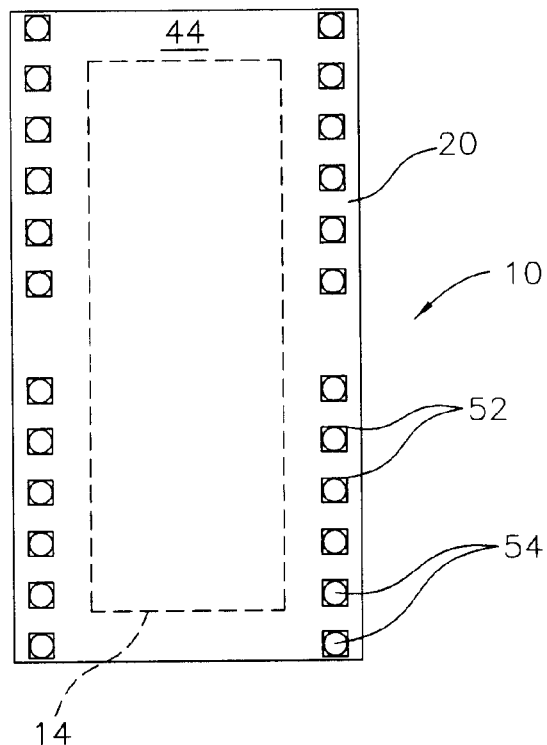
FIG. 1C is a bottom view of the package taken along line 1C—1C of FIG. 1A illustrating external contacts of the package.
Figure 1D:
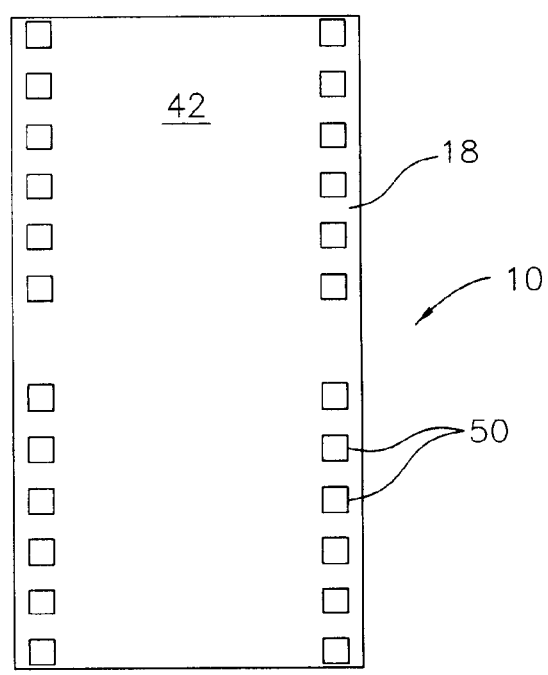
FIG. 1D is a plan view of the package taken along line 1D—1D of FIG. 1A illustrating external contacts of the package.

The conductive vias 38 in the first insulating layer 18 terminate on the first side 34 of the conductive layer 16 in electrical communication with the conductive traces 22. In addition, as shown in FIG. 1D, a plurality of first external contacts 50, are formed on the surface 42 of the first insulating layer 18 in electrical communication with the conductive vias 38. In the illustrative embodiment, the first external contacts 50 comprise generally square shaped, planar pads arranged along the longitudinal edges of the package 10. However, the first external contacts 50 can have other shapes and can be arranged in other configurations, such as a dense grid array of rows and columns. In addition, the first external contacts 50 can comprise any suitable conductive material such as copper, aluminum or a conductive polymer. Also, the first external contacts 50 can be formed on the surface 42 using any suitable process such as plating, electroless deposition or screen printing.

Figure 4:
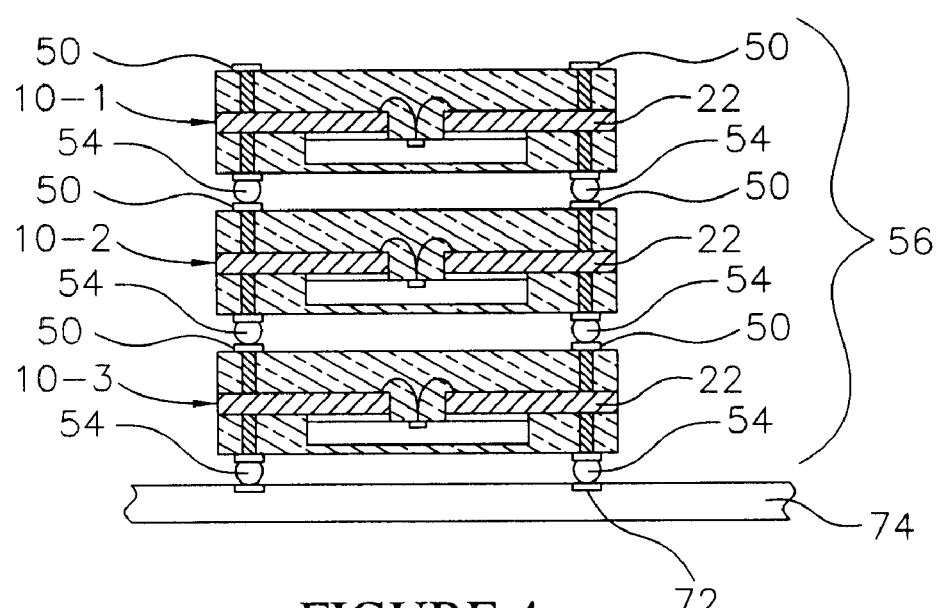
FIG. 4 is a cross sectional view of an assembly constructed using several of the packages of FIG. 1A.

The conductive vias 40 in the second insulating layer 20 terminate on the second side 36 of the conductive layer 16 in electrical communication with the conductive traces 22. In addition, as shown in FIG. 1C, a plurality of second external contacts 52, are formed on the surface 44 of the second insulating layer 20 in electrical communication with the conductive vias 40. The second external contacts 52 are arranged in a pattern that matches the pattern of the first external contacts 50. This permits the package 10 to be stacked to similar packages to form an electronic assembly 56 (FIG. 4). The second external contacts 52 can have the same configuration, and can comprise the same material as the first external contacts 52. In addition, the second external contacts 52 can include metal or conductive polymer contact balls 54 configured to facilitate bonding to the first external contacts 50 on an adjacent package of the electronic assembly 56 (FIG. 4).

Figure 2A:
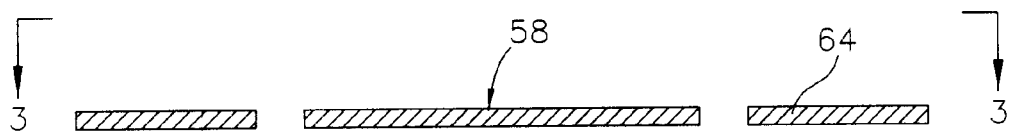
FIGS. 2A–2E are schematic cross sectional views illustrating steps in a method for fabricating the package of FIG. 1A.

Referring to FIGS. 2A–2E, steps in a method for fabricating the package 10 are illustrated. Initially, as shown in FIG. 2A, a lead frame 58 is provided. As shown in FIG. 3, the lead frame 58 includes a plurality of patterns of lead fingers 60 which are connected to one another by bus bars 64. For simplicity only two patterns of lead fingers 60 are illustrated, and only two packages 10 at a time are being fabricated. However, the lead frame 58 can include any suitable number of patterns of lead fingers 60 (e.g., 2–12), and a corresponding number of packages 10 can be fabricated at the same time. The patterns of lead fingers 60 will subsequently become the conductive layers 16, and the conductive traces 22 for the packages 10. As also shown in FIG. 3, the lead frame 58 includes spaced side rails 62 that facilitate handling by automated equipment such as die attachers and wire bonders.

Figure 2B:
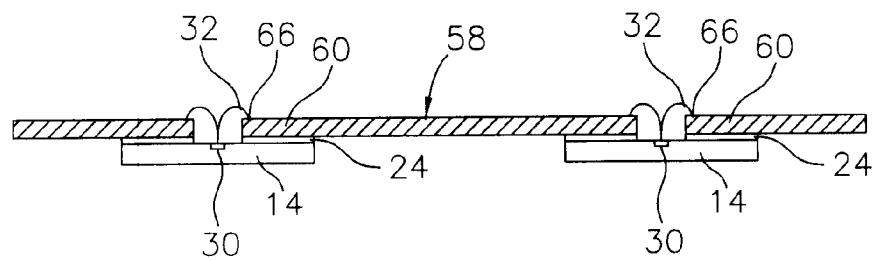
Figure 3:
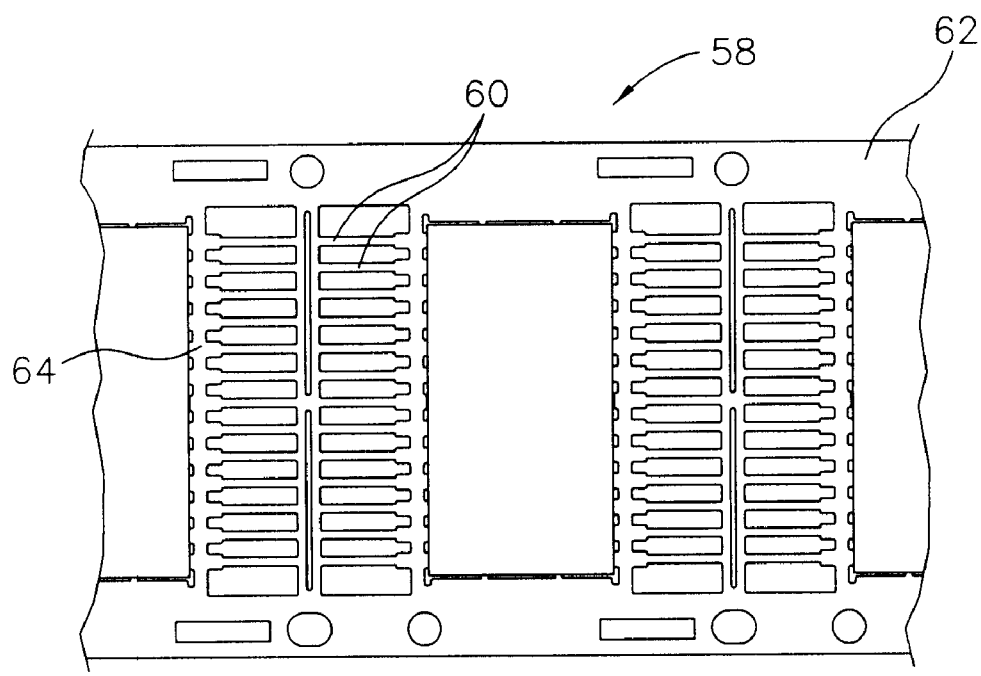
FIG. 3 is a plan view taken along line 3—3 of FIG. 2A illustrating the conductive layer prior to fabrication of the package.

Next, as shown in FIG. 2B, semiconductor dice 14 are attached to the patterns of lead fingers 60 on the lead frame 58 using adhesive layers 24. A conventional die attacher, and conventional die attach materials for the adhesive layers 24, can be used to attach the dice 14 to the lead frame 58. As also shown in FIG. 2B, wires 32 are wire bonded to the die contacts 30 on the die 14 and to bonding sites 66 on the lead fingers 60. The bonding sites 66 can comprise a wire bondable metal plating on the lead fingers 60 such as silver or gold. In addition, a conventional wire bonder can be used to wire bond the dice 14 to the lead fingers 64.

Figure 2C:
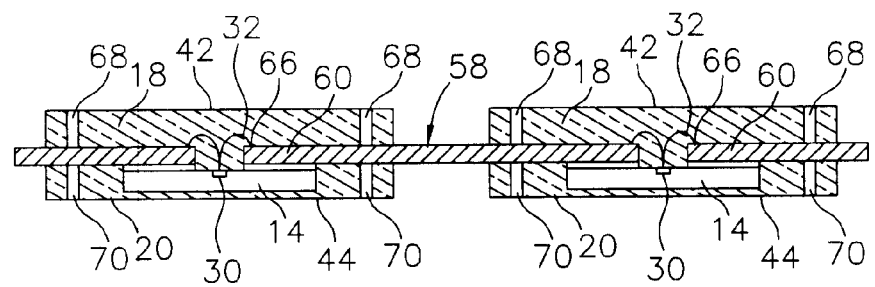

Next, as shown in FIG. 2C, the first insulating layer 18 and the second insulating layer 20 for each package 10 are formed on the lead frame 58. The insulating layers 18, 20 can comprise a curable polymer such as photoimageable resist, polyimide, BCB (benzocyclobutene) or a thermal set epoxy, formed using a suitable process such as molding, or dispensing through a nozzle. Alternately, the insulating layers 18, 20 can comprise a tape material such as polyimide tape, or "KAPTON TAPE" having an adhesive surface which adheres to the conductive layer 16. The insulating layers 18, 20 are formed with thicknesses sufficient to cover the wires 32 and the dice 14. Specifically, a thickness of the insulating layers 18 is greater than a loop height of the wires 32, and a thickness of the insulating layers 20 is greater than a thickness of the dice 14. Also, the insulating layers 18 are formed with the planar surfaces 42, and the insulating layers 20 are formed with the planar surfaces 44.

As also shown in FIG. 2C, openings 68 are formed through the surfaces 42 of the insulating layers 18 to the lead fingers 60, and openings 70 are formed through the surfaces 44 of the insulating layers 20 to the lead fingers 60. The openings 68, 70 are preferably formed in patterns that match desired patterns for the external contacts 50, 52 for the packages 10. With the insulating layers 18, 20 comprising a photoimageable resist the openings 68, 70 can be formed by exposing areas of the resist corresponding to the openings 68, 70, and then developing the resist to remove the exposed material. One suitable resist is a negative tone, thick film resist sold by Shell Chemical under the trademark "EPON RESIN SU-8". This resist can be deposited with a thickness of from about 3–50 mils and can be developed with high aspect ratio features. The openings 68, 70 can also be formed using a mask and an etchant, or can be laser machined through the insulating layers 18, 20. A representative diameter of the openings 68, 70 can be from about 10 $\mu$m to 2 mils or greater.

Figure 2D:
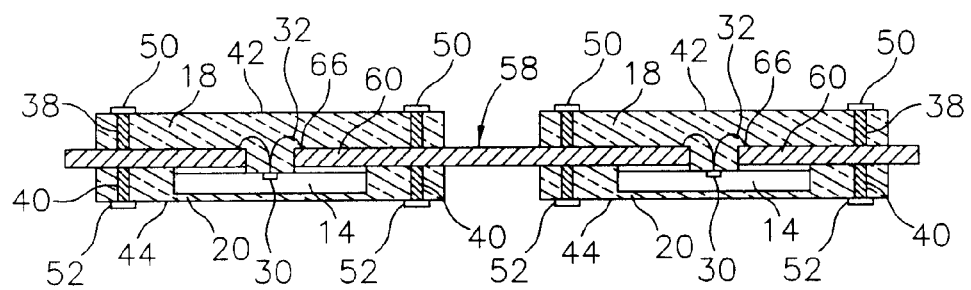

Next, as shown in FIG. 2D, the openings 68, 70 can be at least partially filled with a conductive material such as a metal, or a conductive polymer, to form the conductive vias 38, 40. One method for depositing a metal in the openings is using an electrolytic deposition process. In this case the bus bars 64 (FIG. 3) on the lead frame 58 can be connected to a current source, such that a metal contained in an electrolytic solution will plate onto areas of the lead fingers 60 aligned with the openings 68, 70. This metal will also fill the openings 68, 70.

A metal can also be deposited within the openings 68, 70 using another deposition process, such as CVD or electroless deposition. A solder metal can also be screen printed in the openings 68, 70 as well as with capillary action, or with a vacuum system using a hot solder wave. In addition, the metal can completely fill the openings 68, 70, or alternately can be layers that cover just the inside surfaces or sidewalls of the openings 68, 70. Also, rather than being a metal, the conductive material can comprise a conductive polymer, such as a metal filled silicone, or an isotropic epoxy. A conductive polymer can be deposited within the openings 68, 70, as a viscous material, and then cured as required. A suitable deposition process, such as screen printing, or stenciling, can be used to deposit the conductive polymer into the openings 68, 70.

As also shown in FIG. 2D, the external contacts 50, 52 can be formed on the surfaces 42, 44 in electrical communication with the conductive vias 38, 40. The external contacts 50, 52 can have a square, rectangular, circular or other peripheral configuration. In addition, the external contacts 50, 52 can be formed during formation of the conductive vias 38, 40 of a same material using a suitable mask (not shown), such as a hard mask, or a stencil mask. Alternately, the external contacts 50, 52 can comprise a different material than the conductive vias 38, 40, and can be formed using a separate deposition process.

Figure 2E:
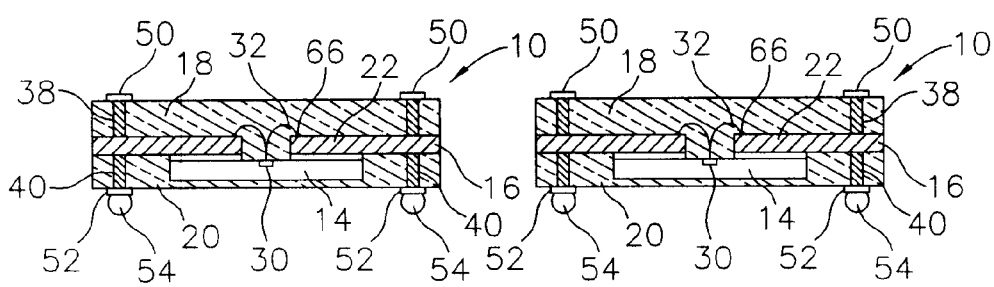

Next, as shown in FIG. 2E, the lead frame can be trimmed to separate the packages 10. Also, either prior to, or after the separation process, the contact balls 54 can be formed on the external contacts 52. The contact balls 54 can be attached to the external contacts 52 by soldering, laser reflow, brazing, welding, or applying a conductive adhesive. A solder ball bumper can also be used to bond the contact balls 54 to the external contacts 52. A suitable solder ball bumper is manufactured by Pac Tech Packaging Technologies of Falkensee, Germany. The contact balls 54 can also be formed on the external contacts 52 using a conventional wire bonder apparatus adapted to form a ball bond, and then to sever the attached wire. The contact balls 54 can also be formed by electrolytic deposition, or electroless deposition, of a metal to form bumps. The contact balls 54 can also comprise a conductive polymer deposited using a suitable deposition process such as screen printing. A representative diameter for the contact balls 54 can be from about 4 mils to 50 mils or more.

Referring to FIG. 4, the electronic assembly 56 is illustrated. The assembly 56 comprises three separate packages 10-1, 10-2, 10-3 that have been stacked and bonded to one another. A solder reflow process, performed in an oven or with a localized heat source, can be used to bond the contact balls 54, and the external contacts 50, on adjacent packages 10. In addition, the contact balls 54 on the lowermost package 10-3 have been bonded to electrodes 72 on a supporting substrate 74 such as a printed circuit board or a multi chip module substrate. The construction of the packages 10-1, 10-2, 10-3 allows the contact balls 54 on the middle package 10-2 to be bonded to the external contacts 50 on the lowermost package 10-3. In addition, the contact balls 54 on the top package 10-1 are bonded to the external contacts 50 on the middle package 10-2.

One feature of the assembly 56 is that the packages 10-1, 10-2, 10-3 can have different circuit arrangements. Specifically the conductive traces on each of the packages 10-1, 10-2, 10-3 can have a different configuration. Alternately, the wire bonding configuration for the packages 10-1, 10-2, 10-3 can be made to provide different circuit arrangements. In either case, with the different circuit arrangements each of the packages 10-1, 10-2, 10-3 can perform a different electronic function within the assembly 56. For example, some of the packages 10-1, 10-2, 10-3 can perform address functions while others of the packages 10-1, 10-2, 10-3 can perform memory functions.

Referring to FIGS. 5A–5D, a second embodiment semiconductor package 10A constructed in accordance with the invention is illustrated. The package 10A includes a substrate 12A, and a semiconductor die 14A flip chip mounted to the substrate 12A. The substrate 12A comprises three separate layers including a conductive layer 16A, a first insulating layer 18A, and a second insulating layer 20A.

The die 14A includes a semiconductor substrate containing integrated circuits fabricated substantially as previously described for the die 14. In addition, the die 14A includes a circuit side 26A (face) and a back side 28A. In addition, the die 14A includes a pattern of die contacts 30A (FIG. 5D) on the circuit side 26A in electrical communication with the integrated circuits contained on the die 14A. In this embodiment, the die contacts 30A comprise bond pads provided with bumps 76A made of solder or other bondable material. This type of die 14A is sometimes referred to as a "bumped die". In addition, the die contacts 30A are arranged in an area array of rows and columns. In the illustrative embodiment the die 14A has a generally square peripheral outline, and the package 10A also has a generally square peripheral outline.

Figure 5A:
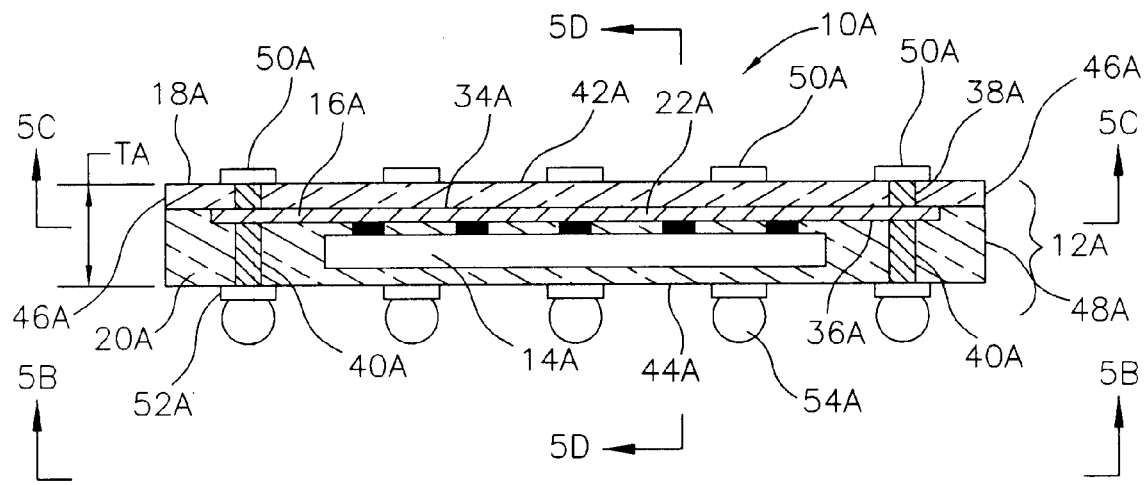
FIG. 5A is an enlarged cross sectional view of a second embodiment semiconductor package constructed in accordance with the invention.
Figure 5B:
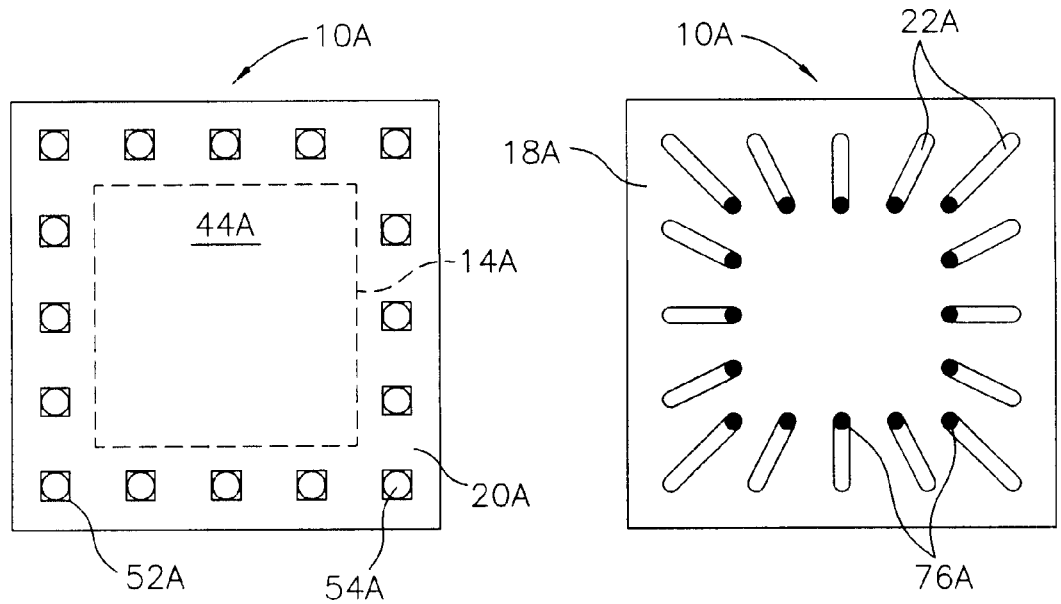
FIG. 5B is a bottom view taken along line 5B—5B of FIG. 5A illustrating external contacts of the package.
Figure 5C:
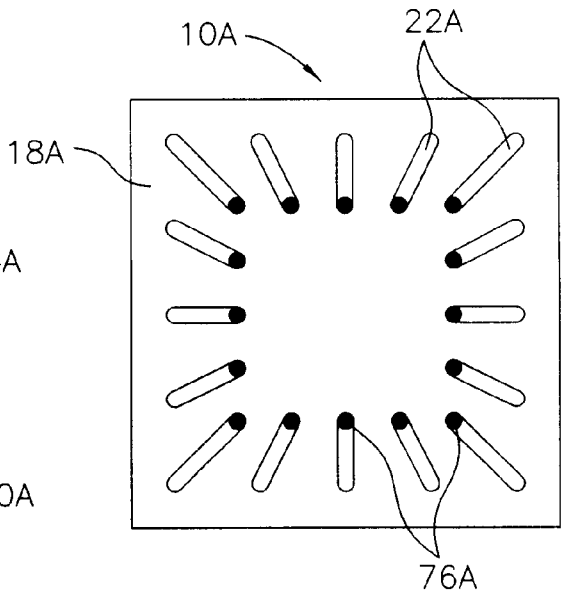
FIG. 5C is a cross sectional view taken along line 5C—5C of FIG. 5A illustrating a conductive layer of the package.
Figure 5D:
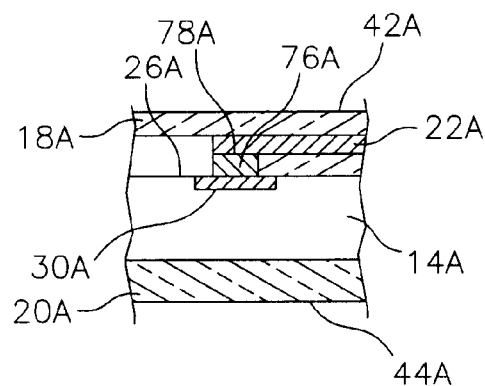
FIG. 5D is a cross sectional view taken along section line 5D—5D of FIG. 5A illustrating flip chip bonding of bumps on a die to the conductive layer.

As shown in FIG. 5C, the conductive layer 16A includes a pattern of conductive traces 22A, and the die 14A is flip chip mounted to the conductive traces 22A. The conductive traces 22A can comprise a highly conductive metal such as an alloy of copper. As shown in FIG. 5D, the bumps 76A on the die contacts 30A are bonded to bonding sites 78A on the conductive traces 22A. The bonding sites 78A can include a plated metal, such as silver or gold, which facilitates bonding to the bumps 76A.

As shown in FIG. 5A, the first insulating layer 18A is formed on a first side 34A of the conductive layer 16A, and the second insulating layer 20A is formed on an opposing second side 36 of the conductive layer 16A. The first insulating layer 18A covers and electrically insulates the conductive traces 22A, and the second insulating layer 20 covers and protects the die 14A. The thickness of the insulating layer 18A can be several mils or less. The thickness of the insulating layer 20A can be selected to just cover the die 14A, such that a thickness TA of the package 10A can be as small as possible In addition, the exposed major surfaces 42A, 44A of the insulating layers 18A, 20A can be generally planar as shown, and the edges 46A, 48A of the insulating layers 18A, 20A generally perpendicular to the major surfaces 42A, 44A.

The insulating layers 18A, 20A can be formed of a same material, or can be different materials. For example, the insulating layers 18A, 20A can comprise a curable polymer, such as a photoimageable resist, polyimide, BCB (benzocyclobutene) or a thermal set epoxy, formed using a suitable process such as molding, or dispensing through a nozzle. Alternately, the insulating layers 18A, 20A can comprise a tape material such as polyimide tape, or "KAPTON TAPE" having an adhesive surface which adheres to the conductive layer 16A.

As also shown in FIG. 5A, the package 10A includes conductive vias 38A in the first insulating layer 18A, and conductive vias 40A in the second insulating layer 20A. The conductive vias 38A, 40A comprise openings in the insulating layers 18A, 20A at least partially filled with a conductive material, such as a metal or a conductive polymer. The openings for the conductive vias 38A, 40A can be formed using a suitable process such as developing, etching or laser machining the insulating layers 18A, 20A.

The conductive vias 38A in the first insulating layer 18A terminate on the first side 34A of the conductive layer 16A in electrical communication with the conductive traces 22A. In addition, a plurality of first external contacts 50A, are formed on the surface 42A of the first insulating layer 18A in electrical communication with the conductive vias 38A. In the illustrative embodiment, the first external contacts 50A comprise generally square shaped, planar pads arranged along a periphery of the package 10A in rows and columns. However, the first external contacts 50A can have other shapes and can be arranged in other configurations, such as a dense grid array of rows and columns. In addition, the first external contacts 50A can comprise any suitable conductive material such as copper, aluminum or a conductive polymer. Also, the first external contacts 50A can be formed on the surface 42A using any suitable process such as plating, electroless deposition or screen printing.

Figure 8:
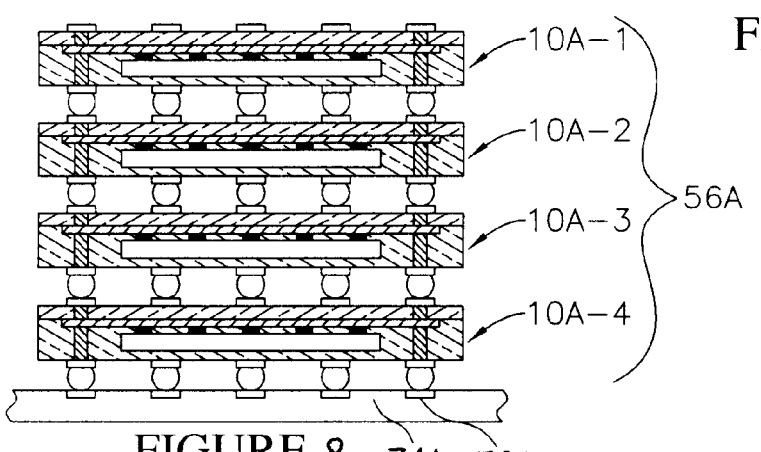
FIG. 8 is a cross sectional view of an assembly constructed using several of the packages of FIG. 5A.

The conductive vias 40A in the second insulating layer 20A terminate on the second side 36A of the conductive layer 16A in electrical communication with the conductive traces 22A. In addition, as shown in FIG. 5B, a plurality of second external contacts 52A, are formed on the surface 44A of the second insulating layer 20A in electrical communication with the conductive vias 40A. The second external contacts 52A are arranged in a pattern that matches the pattern of the first external contacts 50A. This permits the package 10A to be stacked to similar packages to form an electronic assembly 56A (FIG. 8). The second external contacts 52A can have a same configuration and can comprise the same material as the first external contacts 52A. In addition, the second external contacts 52A can include metal or conductive polymer contact balls 54A configured to facilitate bonding to the first external contacts 50A on an adjacent package of the electronic assembly 56A (FIG. 8).

Figure 7A:
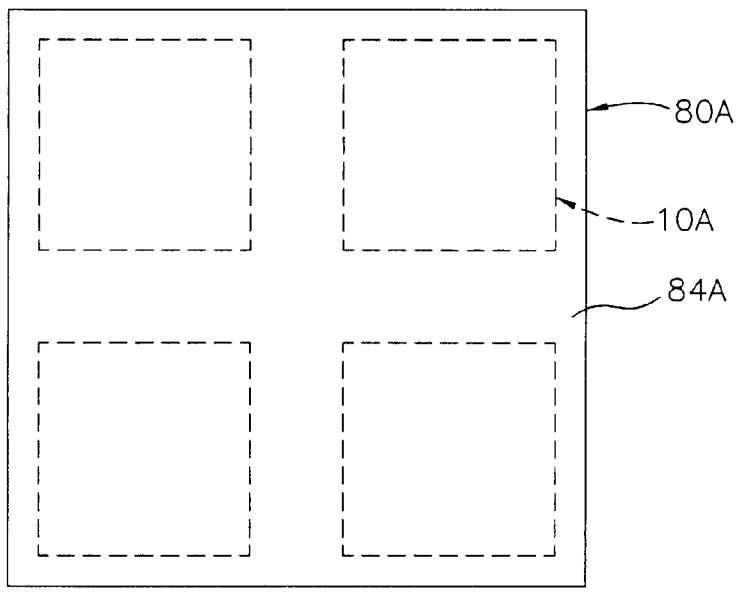
FIG. 7A is a plan view taken along line 7A—7A of FIG. 6A illustrating a bi-material panel for fabricating the package of FIG. 5A.
Figure 6A:
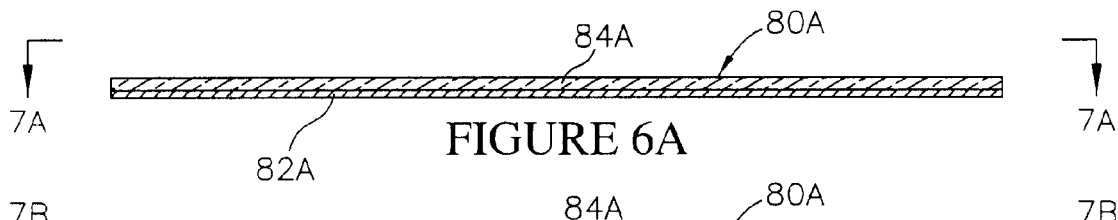
FIGS. 6A–6G are schematic cross sectional views illustrating steps in a method for fabricating the package of FIG. 5A.

Referring to FIGS. 6A–6G, steps in a method for fabricating the package 10A are illustrated. Initially, as shown in FIG. 6A, a panel 80A which comprises a metal layer 82A and a first insulating layer 84A is provided. As shown in FIG. 7A, the panel is configured to fabricate four packages 10A as indicated by the dotted lines. As is apparent, the panel 80A can be configured to fabricate a greater or lesser number of packages 10A.

The first insulating layer 84A will subsequently become the first insulating layer 18A (FIG. 5A) for each of the packages 10A. The first insulating layer 84A can comprise an electrically insulating material such as an organic polymer resin reinforced with glass fibers. Exemplary materials include bismaleimide-triazine (BT), epoxy resins (e.g., "FR-4" and "FR-5"), and polyimide resins. These materials can be formed with a desired thickness, and then punched, machined, or otherwise formed with a required peripheral configuration, and with required features.

The metal layer 82A comprises a highly conductive metal which is blanket deposited or laminated to the first insulating layer 84A, and will be subsequently etched to form the conductive traces 22A. However, it is to be understood that an additive process, such as electroless deposition through a mask, can be used to form the conductive traces 22A in required patterns. A preferred metal for the metal layer 82A is copper. Other suitable metals include aluminum, titanium, tungsten, tantalum, platinum, molybdenum, cobalt, nickel, gold, and iridium. If desired, the metal layer 82A and the insulating layer 84A can be constructed from a commercially produced bi-material core, such as a copper clad bismaleimide-triazine (BT) core, available from Mitsubishi Gas Chemical Corp., Japan. A representative weight of the copper can be from 0.5 oz to 2 oz. per square foot.

Figure 7B:
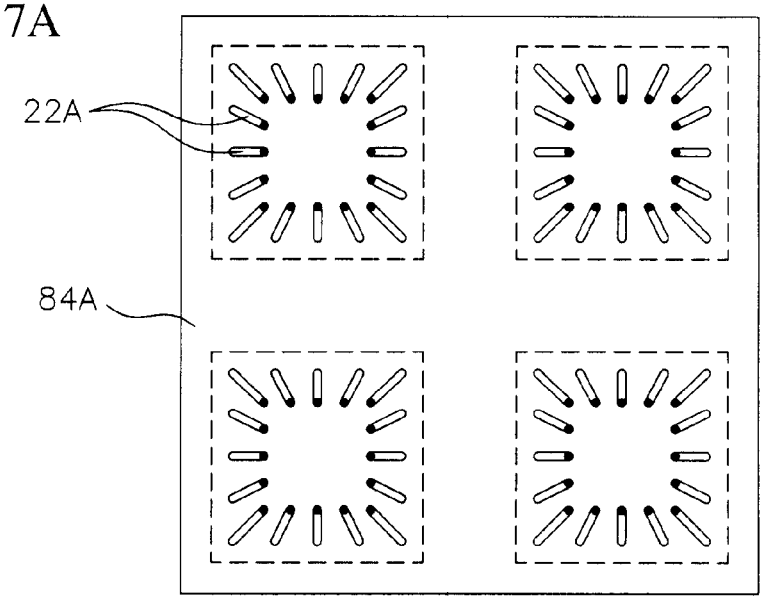
FIG. 7B is a bottom view taken along line 7B—7B of FIG. 6B illustrating patterns of conductive traces on the panel.
Figure 6B:
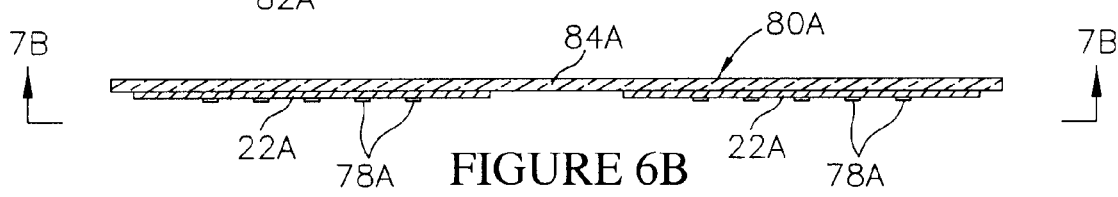

Next, as shown in FIG. 6B, the metal layer 82A is etched to form the conductive traces 22A. The etching step can be performed by forming a mask (not shown) on the metal layer 82A, such as a resist mask, which includes openings defined by exposure and development steps, and then etching through the openings in the mask. FIG. 7B illustrates the four separate patterns of conductive traces 22A formed by the etching step. These separate patterns will be used to fabricate four separate packages 10A. Following the etching step the bonding sites 78A can also be formed on the conductive traces 22A by plating a metal such as gold or silver in areas that correspond to the location of the bumps 76A on the die 14A. Again, a mask (not shown) can be used to perform the plating step.

Figure 6C:
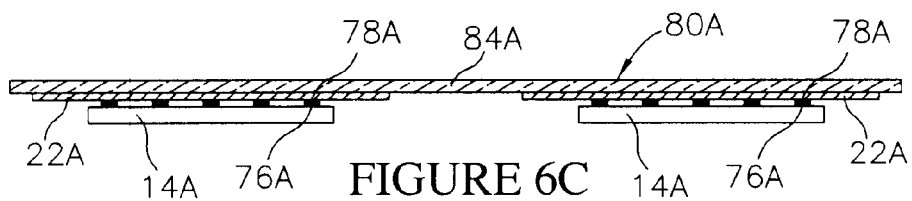

Next, as shown in FIG. 6C, the semiconductor dice 14A are flip chip bonded to the conductive traces 22A. During the flip chip bonding step, the bumps 76A on the dice 14A are aligned with, and then bonded to the bonding sites 78A on the conductive traces 22A. The flip chip bonding step can be performed using techniques and equipment that are known in the art. For example, flux can be applied to the bonding sites 78A to temporarily hold the dice 14A on the bonding sites 78A. The bumps 76A can then be heated in an oven, or using a localized heat source, to reflow the solder and form a metallurgical bond between the bumps 76A and the bonding sites 78A.

Figure 6D:
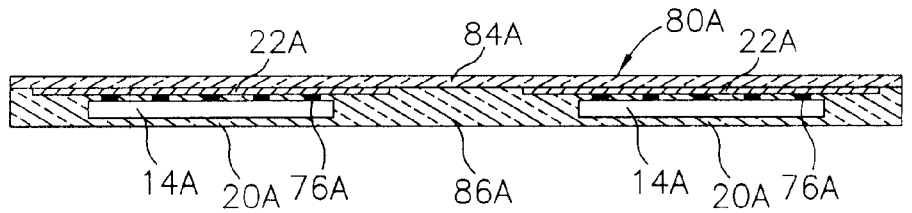

Next, as shown in FIG. 6D, a second insulating layer 86A can be blanket formed on the panel 80A to cover the dice 14A. The second insulating layer 86A will subsequently become the second insulating layer 20A (FIG. 5A) for each package 10A. The second insulating layer 86A can comprise a curable polymer such as photoimageable resist, polyimide, BCB (benzocyclobutene) or a thermal set epoxy, formed using a suitable process such as molding, or dispensing through a nozzle.

Figure 6E:
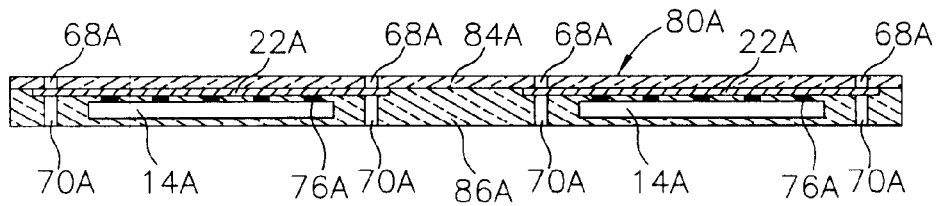

Next as shown in FIG. 6E, openings 68A are formed through the insulating layer 84A to the conductive traces 22A, and openings 70A are formed through the insulating layer 86A to the conductive traces 22A. The openings 68A, 70A are preferably formed in patterns that match desired patterns for the external contacts 50A, 52A for the packages 10A. The openings 68A, 70A can be formed using a developing, etching or laser machining process as previously described.

Figure 6F:
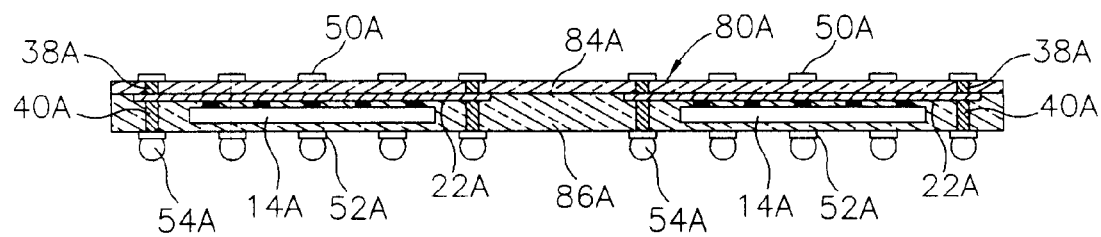

Next, as shown in FIG. 6F, the openings 68A, 70A can be at least partially filled with a conductive material such as a metal or a conductive polymer to form the conductive vias 38A, 40A. This step can also be performed as previously described. As also shown in FIG. 6F the external contacts 50A, 52A and contact balls 54A can also be formed as previously described.

Figure 6G:
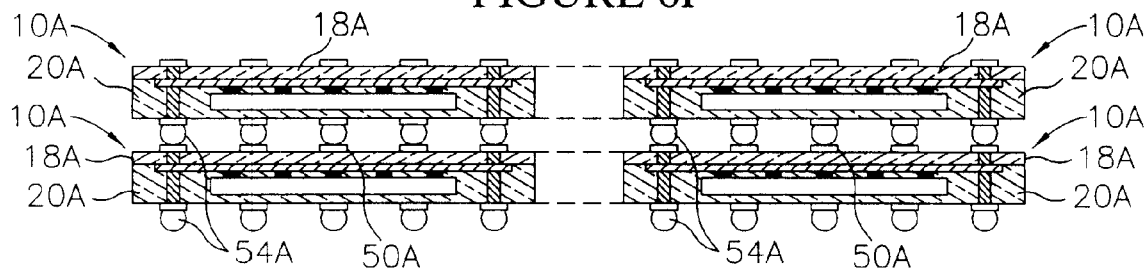

Next, as shown in FIG. 6G, a singulating step can be performed to separate the packages 10A from the panel 80A. The singulating step can be performed using a suitable process such as cutting, shearing, punching or etching. In the singulated packages 10A, the first insulating layer 84A becomes the first insulating layers 18A for the packages 10A. Similarly, the second insulating layer 86A becomes the second insulating layers 20A for the packages 10A.

As also shown in FIG. 6G, prior to the singulating step, two or more panels 80A can be stacked, and the contact balls 54A and external contacts 50A on adjacent packages 10A bonded to another. A solder reflow process, performed in an oven or with a localized heat source, can be used to bond the contact balls 54A and the external contacts 50A on adjacent packages 10A. Following the bonding step, the panels 80A can be singulated to form stacked assemblies, such as the assembly 56A shown in FIG. 8.

Referring to FIG. 8, the electronic assembly 56A is illustrated. The assembly 56A comprises four separate packages 10A-1, 10A-2, 10A-3, 10A-4 that have been stacked and bonded to one another. In addition, the contact balls 54A on the lowermost package 10A-4 have been bonded to electrodes 72A on a supporting substrate 74A such as a printed circuit board or a multi chip module substrate. As previously described the different packages 10A-1, 10A-2, 10A-3, 10A-4 of the assembly 56A can have different circuit arrangements and can perform different circuit functions in the assembly 56A.

Thus the invention provides a stackable semiconductor package, a method for fabricating the package, and an electronic assembly including two or more of the packages in a stacked configuration. Although the invention has been described with reference to certain preferred embodiments, as will be apparent to those skilled in the art, certain changes and modifications can be made without departing from the scope of the invention as defined by the following claims.

We claim:

1. A method for fabricating a semiconductor package comprising:

providing a conductive layer having a first side and an opposing second side, and comprising a plurality of conductive traces;

flip chip bonding a semiconductor die to the conductive layer in electrical communication with the conductive traces;

forming a first insulating layer on the first side;

forming a second insulating layer on the second side at least partially covering the die;

forming a plurality of external contacts on the first insulating layer and on the second insulating layer; and forming a plurality of conductive vias in the first insulating layer and in the second insulating layer in electrical communication with the external contacts and the conductive traces.

2. The method of claim 1 wherein the first insulating layer or the second insulating layer comprises a resist.

3. The method of claim 1 wherein the first insulating layer or the second insulating layer comprises a resist and the forming the conductive vias step comprises exposing and developing the resist.

4. The method of claim 1 further comprising stacking and bonding a second semiconductor package to the semiconductor package.

5. A method for fabricating a semiconductor package comprising:
   providing a conductive layer having a first side and an opposing second side and comprising a plurality of conductive traces;
   attaching a semiconductor die to the conductive layer in electrical communication with the conductive traces;
   forming a first insulating layer on the first side and a second insulating layer on the second side at least partially covering the die, the first insulating layer and the second insulating layer comprising a polymer resist;
   forming a plurality of external contacts on the first insulating layer and on the second insulating layer; and
   forming a plurality of conductive vias in the first insulating layer and in the second insulating layer in electrical communication with the external contacts and the conductive traces by exposing and developing the resist.

6. A method for fabricating a semiconductor package comprising:
   providing a conductive layer having a first side and an opposing second side and comprising a plurality of conductive traces;
   attaching a semiconductor die to the conductive layer in electrical communication with the conductive traces;
   forming a first insulating layer on the first side, the first insulating layer comprising a glass resin and the conductive traces comprising a metal layer bonded to the first insulating layer;
   forming a second insulating layer on the second side at least partially covering the die;
   forming a plurality of external contacts on the first insulating layer and on the second insulating layer; and
   forming a plurality of conductive vias in the first insulating layer and in the second insulating layer in electrical communication with the external contacts and the conductive traces.

7. A method for fabricating a semiconductor package comprising:
   providing a conductive layer having a first side and an opposing second side and comprising a plurality of conductive traces;
   attaching a semiconductor die to the conductive layer in electrical communication with the conductive traces;
   forming a first insulating layer on the first side;
   forming a second insulating layer on the second side at least partially covering the die;
   forming a plurality of external contacts on the first insulating layer and on the second insulating layer;
   forming a plurality of conductive vias in the first insulating layer and in the second insulating layer in electrical communication with the external contacts and the conductive traces; and
   stacking and bonding a second semiconductor package to the semiconductor package.

8. A method for fabricating a semiconductor package comprising:
   providing a conductive layer having a first side and an opposing second side and comprising a plurality of conductive traces;
   attaching a semiconductor die to the conductive layer in electrical communication with the conductive traces;
   forming a first insulating layer on the first side;
   forming a second insulating layer on the second side at least partially covering the die;
   forming a plurality of external contacts on the first insulating layer and on the second insulating layer;
   forming a plurality of conductive vias in the first insulating layer and in the second insulating layer in electrical communication with the external contacts and the conductive traces; and
   stacking and bonding a second semiconductor package to the semiconductor package, the second semiconductor package comprising a plurality of second conductive traces having a different configuration than the conductive traces.

9. A method for fabricating a semiconductor package comprising:
   providing a conductive layer comprising a plurality of conductive traces, the conductive layer comprising a segment of a lead frame having a first surface and an opposing second surface;
   attaching a semiconductor die to the conductive traces;
   wire bonding a plurality of wires to the die and to the conductive traces;
   forming a first insulating layer on the wires and on the first side;
   forming a second insulating layer on the die and on the second side, the second insulating layer comprising a polymer resist;
   forming a plurality of external contacts on the first insulating layer and on the second insulating layer;
   forming a plurality of first conductive vias in the first insulating layer in electrical communication with the external contacts and the conductive traces by exposing and developing the resist; and
   forming a plurality of second conductive vias in the second insulating layer in electrical communication with the external contacts and the conductive.

10. The method of claim 9 wherein the attaching the semiconductor die step comprises forming an adhesive layer between the die and the conductive layer.

11. A method for fabricating a semiconductor package comprising:
    providing a conductive layer comprising a plurality of conductive traces, the conductive layer comprising a segment of a lead frame having a first surface and an opposing second surface;
    attaching a semiconductor die to the conductive traces;
    wire bonding a plurality of wires to the die and to the conductive traces;
    forming a first insulating layer on the wires and on the first side, the first insulating layer comprising a polymer resist;
    forming a second insulating layer on the die and on the second side;

forming a plurality of external contacts on the first insulating layer and on the second insulating layer;

forming a plurality of first conductive vias in the first insulating layer in electrical communication with the external contacts and the conductive traces by exposing and developing the resist; and forming a plurality of second conductive vias in the second insulating layer in electrical communication with the external contacts and the conductive traces.

12. A method for fabricating a semiconductor package comprising:

providing a conductive layer comprising a plurality of conductive traces, the conductive layer comprising a segment of a lead frame having a first surface and an opposing second surface;

attaching a semiconductor die to the conductive traces;

wire bonding a plurality of wires to the die and to the conductive traces;

forming a first insulating layer on the wires and on the first side;

forming a second insulating layer on the die and on the second side;

forming a plurality of external contacts on the first insulating layer and on the second insulating layer;

forming a plurality of conductive vias in the first insulating layer and in the second insulating layer in electrical communication with the external contacts and the conductive traces; and stacking and bonding a second semiconductor package to the semiconductor package.

13. A method for fabricating a semiconductor package comprising:

providing a conductive layer comprising a plurality of conductive traces, the conductive layer comprising a segment of a lead frame having a first surface and an opposing second surface;

attaching a semiconductor die to the conductive traces;

wire bonding a plurality of wires to the die and to the conductive traces;

forming a first insulating layer on the wires and on the first side;

forming a second insulating layer on the die and on the second side;

forming a plurality of external contacts on the first insulating layer and on the second insulating layer;

forming a plurality of conductive vias in the first insulating layer and in the second insulating layer in electrical communication with the external contacts and the conductive traces; and stacking and bonding a second semiconductor package to the semiconductor package, the second semiconductor package comprising a plurality of second conductive traces having a different configuration than the conductive traces.

14. A method for fabricating a semiconductor package comprising:

providing a conductive layer comprising a plurality of conductive traces having a first surface and an opposing second surface;

flip chip bonding a semiconductor die to the conductive traces;

forming a first insulating layer on the first side;

forming a second insulating layer on the die and on the second side;

forming a plurality of external contacts on the first insulating layer and on the second insulating layer; and forming a plurality of conductive vias in the first insulating layer and in the second insulating layer in electrical communication with the external contacts and the conductive traces.

15. The method of claim 14 wherein the providing the conductive layer step and the forming the first insulating layer step comprise providing the conductive layer and the first insulating layer as a bi-material panel.

16. The method of claim 14 wherein the first insulating layer or the second insulating layer comprises a polymer resist and the forming the conductive vias step comprises exposing and developing the resist.

17. The method of claim 14 further comprising stacking and bonding a second semiconductor package to the semiconductor package.

18. The method of claim 14 further comprising stacking and bonding a second semiconductor package to the semiconductor package, the second semiconductor package comprising a plurality of second conductive traces having a different configuration than the conductive traces.

* * * * *

UNITED STATES PATENT AND TRADEMARK OFFICE
CERTIFICATE OF CORRECTION

PATENT NO.    : 6,451,624 B1
DATED         : September 17, 2002
INVENTOR(S)   : Warren M. Farnworth, Alan G. Wood and Mike Brooks It is certified that error appears in the above-identified patent and that said Letters Patent is hereby corrected as shown below:

Column 12,
Line 49, after "conductive" add -- traces --.

Column 14,
Line 20, change "side" to -- surface --.
Line 22, change "side" to -- surface --.

Signed and Sealed this

Tenth Day of December, 2002

JAMES E. ROGAN
*Director of the United States Patent and Trademark Office*